(12) United States Patent
Park et al.

(10) Patent No.: US 9,435,865 B2
(45) Date of Patent: Sep. 6, 2016

(54) METHOD FOR DIAGNOSING FAULT OF FUEL CELL STACK

(71) Applicant: Hyundai Autron Co., Ltd., Seongnam-si (KR)

(72) Inventors: Hyun-Seok Park, Gunpo-Si (KR); Uck-Soo Kim, Anyang-si (KR); Sun-Doo Kang, Yongin-si (KR)

(73) Assignee: Hyundai Autron Co., Ltd., Seongnam-si (KR)

( * ) Notice: Subject to any disclaimer, the term of this patent is extended or adjusted under 35 U.S.C. 154(b) by 288 days.

(21) Appl. No.: 14/135,300

(22) Filed: Dec. 19, 2013

(65) Prior Publication Data

US 2014/0176144 A1 Jun. 26, 2014

(30) Foreign Application Priority Data

Dec. 20, 2012 (KR) ......................... 10-2012-0149914

(51) Int. Cl.
*G01N 27/416* (2006.01)
*G01R 31/36* (2006.01)
*H01M 8/04* (2016.01)
*B60L 3/00* (2006.01)
*B60L 3/04* (2006.01)
*B60L 3/12* (2006.01)
*B60L 11/18* (2006.01)
*H01M 8/10* (2016.01)

(52) U.S. Cl.
CPC ......... *G01R 31/3606* (2013.01); *B60L 3/0053* (2013.01); *B60L 3/04* (2013.01); *B60L 3/12* (2013.01); *B60L 11/1883* (2013.01); *B60L 11/1898* (2013.01); *H01M 8/04559* (2013.01); *H01M 8/04649* (2013.01); *H01M 8/04679* (2013.01); *H01M 2008/1095* (2013.01); *Y02E 60/50* (2013.01); *Y02T 90/34* (2013.01)

(58) Field of Classification Search
USPC .......................................................... 324/426
See application file for complete search history.

(56) References Cited

U.S. PATENT DOCUMENTS

| | | | |
|---|---|---|---|
| 2006/0078788 A1* | 4/2006 | Ramschak ...................... | 429/90 |
| 2007/0196707 A1* | 8/2007 | Komachiya et al. ........... | 429/23 |
| 2009/0169934 A1* | 7/2009 | Manabe et al. ................. | 429/22 |
| 2012/0135327 A1* | 5/2012 | Jeong ................ | H01M 8/04313 429/431 |

FOREIGN PATENT DOCUMENTS

| | | |
|---|---|---|
| KR | 10-2010-0121354 A | 11/2010 |
| KR | 10-1090705 B1 | 12/2011 |

* cited by examiner

*Primary Examiner* — Samuel Berhanu
(74) *Attorney, Agent, or Firm* — Morgan, Lewis & Bockius LLP

(57) ABSTRACT

Disclosed herein is a method for diagnosing a fault of a fuel cell stack, including: applying a summed current obtained by summing currents of different frequency regions to the fuel cell stack; passing output voltages of the fuel cell stack through each of the different frequency filters to extract the respective diagnosis data; and diagnosing whether or not a fault has been generated in the fuel cell stack using the respective diagnosis data. Therefore, it is possible to further improve diagnosis analysis capability by applying the summed current obtained by summing the currents of the different frequency regions to the fuel cell stack and then rapidly diagnosing the fault of the fuel cell stack using the diagnosis data obtained by filtering the output voltages of the fuel cell stack.

6 Claims, 4 Drawing Sheets

210

220

310

320

METHOD FOR DIAGNOSING FAULT OF FUEL CELL STACK

CROSS REFERENCE TO RELATED APPLICATION

This application claims the benefit of Korean Patent Application No. 10-2012-0149914, filed on Dec. 20, 2012, which is hereby incorporated by reference in its entirety into this application.

BACKGROUND OF THE INVENTION

1. Technical Field

Exemplary embodiments of the present invention relate to a method for diagnosing a fault of a fuel cell stack.

2. Description of the Related Art

A fuel cell is a kind of power generating device that does not convert chemical energy of a fuel into heat by combustion, but converts the chemical energy into electrical energy by an electrochemical reaction in a stack and may be used to supply power to a small electric/electrical product, particularly, a portable apparatus as well as supply industrial power, home power, and power for driving a vehicle.

As a power supply for driving the vehicle, a polymer electrolyte membrane fuel cell (PEMFC) (proton exchange membrane fuel cell) having the highest power density among fuel cells has been currently studied mainly. The polymer electrolyte membrane fuel cell has a rapid start time due to a low operation temperature and a rapid power conversion reacting time.

The polymer electrolyte membrane fuel cell is configured to include a membrane electrode assembly (MEA) in which catalyst electrode layers in which an electrochemical reaction occur are attached to both sides of a solid polymer electrolyte membrane through which hydrogen ions move, a gas diffusion layer (GLD) serving to uniformly distribute reaction gases and transfer generated electrical energy, a gasket and coupling mechanism maintaining air-tightness of the reaction gases and coolant and appropriate coupling pressure, and a bipolar plate moving the reaction gases and the coolant.

When a fuel cell stack is assembled using the configuration of a unit cell as described above, a combination of the membrane electrode assembly and the gas diffusion layer, which are main components, is positioned in the innermost portion of the cell, the membrane electrode assembly includes the catalyst electrode layers, that is, an anode and a cathode, formed on both surfaces of the polymer electrolyte membrane and having catalysts applied thereto so that oxygen and hydrogen may react to each other, and the gas diffusion layer, the gasket, and the like, are stacked on outer sides of the anode and the cathode.

The bipolar plate provided with a flow field supplying the reaction gases (hydrogen, which is a fuel, and oxygen or air, which is an oxidizer) and passing the coolant therethrough is positioned at an outer side of the gas diffusion layer.

After a plurality of unit cells each having the above-mentioned configuration are stacked, a current collector, an insulating plate, and end plates supporting the stacked unit cells are coupled to the outermost portion. The unit cells are repeatedly stacked and coupled to each other between the end plates to configure the fuel cell stack.

In order to obtain potential actually required in the vehicle, the unit cells should be stacked by the required potential, and a product formed by stacking the unit cells is called a stack. Potential generated by one unit cell is about 1.3V. Therefore, a plurality of cells are stacked in series with each other in order to generate power required for driving the vehicle.

Meanwhile, in a fuel cell vehicle, a voltage of a cell is used to detect performance, an operation state, a fault, and the like, of a stack, and is used for various controls of a system such as a flow rate control of reaction gas. Typically, the bipolar plate is connected to a cell voltage monitoring apparatus through a connector and a conducting wire to monitor the voltage of the cell.

A cell voltage monitoring (CVM) apparatus according to the related art, which directly monitors voltages of all cells or two cells in the stack, uses a scheme in which a main controller (host controller) collecting voltages of all cells integrates and processes monitoring information and a voltage drop generated due to a fault result rather than a fault cause is monitored.

The cell voltage monitoring apparatus as described above has also been used to monitor a battery. Since the cell voltage monitoring apparatus according to the related art directly monitors the voltages of the cells, a position of a fault cell may be monitored. However, since the cell voltage monitoring apparatus according to the related art has a very complicated circuit configuration, it may be difficult to assemble and maintain the cell voltage monitoring apparatus according to the related art. In addition, the cell voltage monitoring apparatus according to the related art is expensive and may not detect a fault cause of the stack.

Further, an electrochemical impedance spectroscopy (EIS) has been used as the related art. The EIS is mainly used to detect an electrode reaction or a feature of a complex in an electrochemical field. The EIS may obtain general information on a nature, a structure, and a reaction of the complex by analyzing a system response and has also been used as a very useful tool in an applied chemistry field, a medical engineering field, a bioengineering field, or the like.

However, the EIS, which is for an off-line, requires a long test time, may not perform real-time monitoring, is expensive, and may be used only for testing a unit cell.

SUMMARY OF THE INVENTION

An object of the present invention is to provide a method for diagnosing a fault of a fuel cell stack capable of further improving diagnosis analysis capability by applying a summed current obtained by summing currents of different frequency regions to the fuel cell stack and then rapidly diagnosing the fault of the fuel cell stack using diagnosis data obtained by filtering output voltages of the fuel cell stack.

Another object of the present invention is to provide a method for diagnosing a fault of a fuel cell stack capable of improving diagnosis analysis capability two times or more by simultaneously monitoring an impedance and a total harmonic distortion (THD) using diagnosis data obtained by filtering output voltages of the fuel cell stack to diagnose a state of an inner portion of the fuel cell stack.

Objects to be solved by the present invention are not limited to the above-mentioned objects, and other objects that are not mentioned may be clearly understood by those skilled in the art in the following description.

According to an exemplary embodiment of the present invention, there is provided a method for diagnosing a fault of a fuel cell stack, including: applying a summed current obtained by summing currents of different frequency regions to the fuel cell stack; passing output voltages of the fuel cell stack through each of the different frequency filters to extract the respective diagnosis data; and diagnosing whether or not a fault has been generated in the fuel cell stack using the respective diagnosis data.

The different frequency regions may include a frequency used to calculate at least one of a total harmonic distortion (THD) and an impedance.

The different frequency filters may include at least one of a band pass filter passing only a specific frequency therethrough and a high pass filter passing a specific frequency to a frequency of the specific frequency or more therethrough.

The passing of the output voltages of the fuel cell stack through each of the different frequency filters to extract the respective diagnosis data may include: passing the output voltages of the fuel cell stack through the high pass filter to extract a basic wave frequency to a harmonic frequency; and passing the output voltages of the fuel cell stack through the band pass filter to extract the specific frequency.

The diagnosing of whether or not the fault has been generated in the fuel cell stack using the respective diagnosis data may include diagnosing whether or not the fault has been generated in the fuel cell stack depending on a ratio of the harmonic frequency to the basic wave frequency extracted by the high pass filter.

The diagnosing of whether or not the fault has been generated in the fuel cell stack using the respective diagnosis data may include diagnosing that the fault has been generated in the fuel cell stack when the ratio of the harmonic frequency to the basic wave frequency is a specific ratio or more.

The diagnosing of whether or not the fault has been generated in the fuel cell stack using the respective diagnosis data may include diagnosing a wetting state of the fuel cell stack using an impedance for the specific frequency extracted by the band pass filter.

The diagnosing of whether or not the fault has been generated in the fuel cell stack using the respective diagnosis data may include diagnosing that an electrolyte membrane of the fuel cell stack is in a dry state when the impedance for the specific frequency is a specific impedance or more.

The diagnosing of whether or not the fault has been generated in the fuel cell stack using the respective diagnosis data may include diagnosing that an electrolyte membrane of the fuel cell stack is in a wet state when the impedance for the specific frequency is a specific impedance or less.

Details of other exemplary embodiments are included in the detailed description and the accompanying drawings of the present invention.

Advantages and/or features of the present invention and methods to achieve them will be elucidated from exemplary embodiments described below in detail with reference to the accompanying drawings. However, the present invention is not limited to exemplary embodiments disclosed below, but will be implemented in various forms. The exemplary embodiments of the present invention make disclosure of the present invention thorough and are provided so that those skilled in the art can easily understand the scope of the present invention. Therefore, the present invention will be defined by the scope of the appended claims. Throughout the description, like reference numerals denote like elements.

DESCRIPTION OF THE EXEMPLARY EMBODIMENTS

Hereinafter, exemplary embodiments of the present invention will be described in detail with reference to the accompanying drawings.

Figure 1:
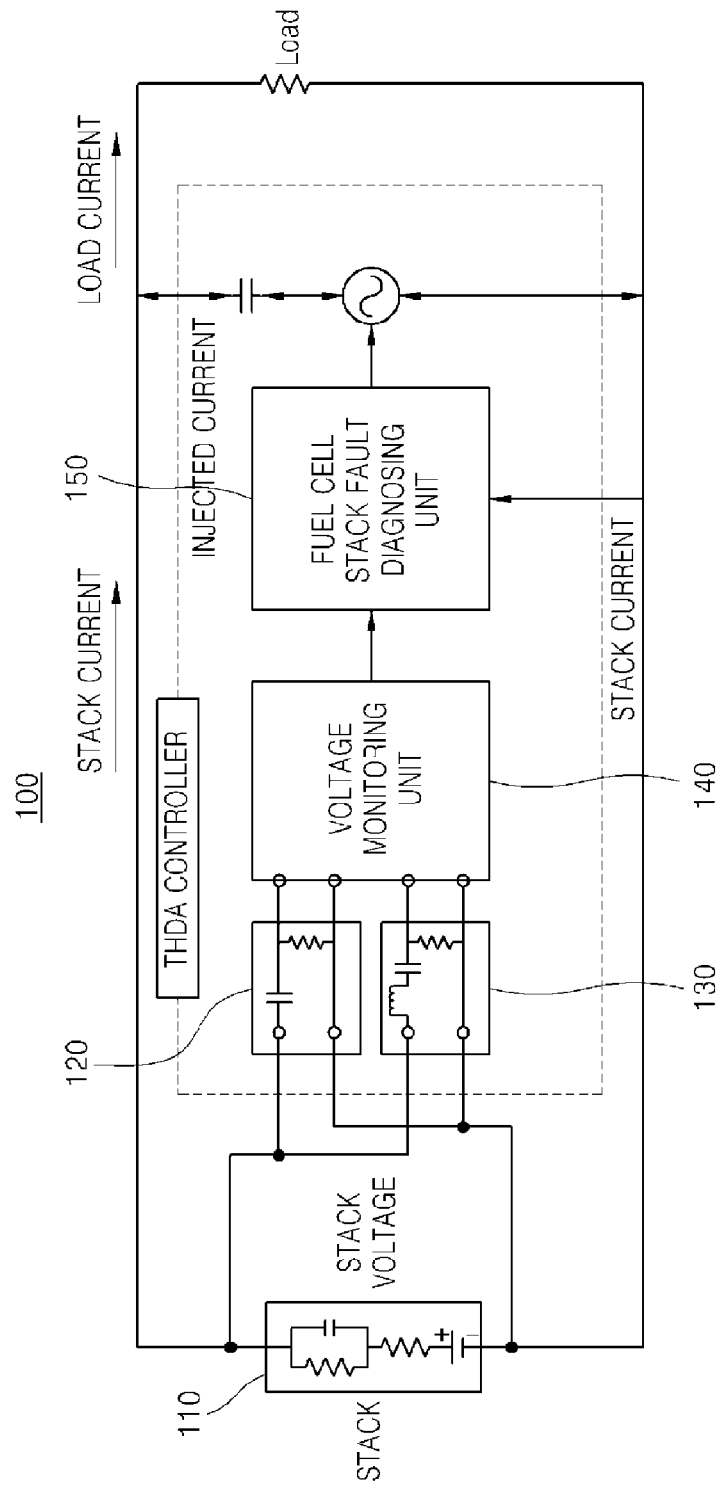
FIG. 1 is a diagram illustrating a connection state of an apparatus for diagnosing a fault of a fuel cell stack for performing a process of diagnosing a fault of a fuel cell stack according to an exemplary embodiment of the present invention.
Figure 2:
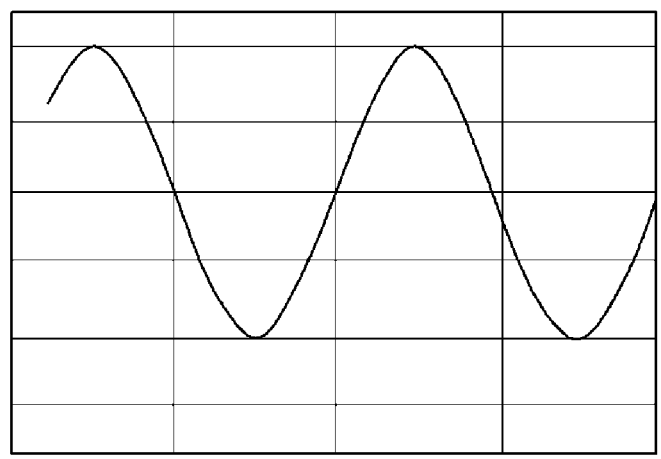
FIG. 2 is a graph illustrating frequencies extracted by each of the first and second frequency filters illustrated in FIG. 1.
Figure 2:
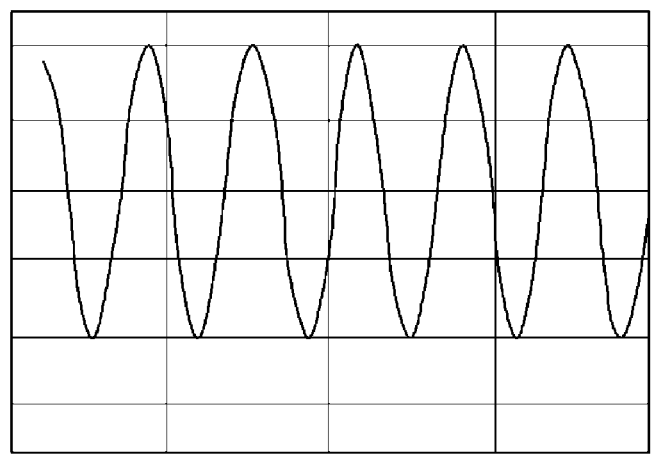

FIG. 1 is a diagram illustrating a connection state of an apparatus for diagnosing a fault of a fuel cell stack for performing a process of diagnosing a fault of a fuel cell stack according to an exemplary embodiment of the present invention; FIG. 2 is a graph illustrating frequencies extracted by each of the first and second frequency filters illustrated in FIG. 1; and FIG. 3 is a graph illustrating diagnosis data extracted by each of the first and second frequency filters illustrated in FIG. 2.

Figure 3:
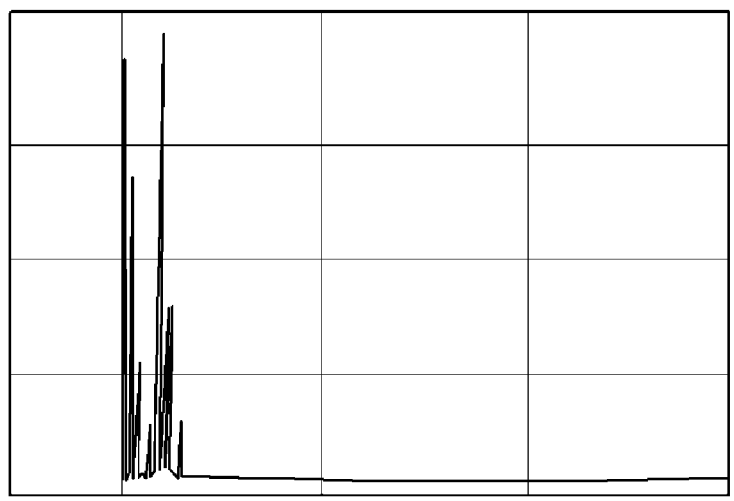
FIG. 3 is a graph illustrating diagnosis data extracted by each of the first and second frequency filters illustrated in FIG. 2.
Figure 3:
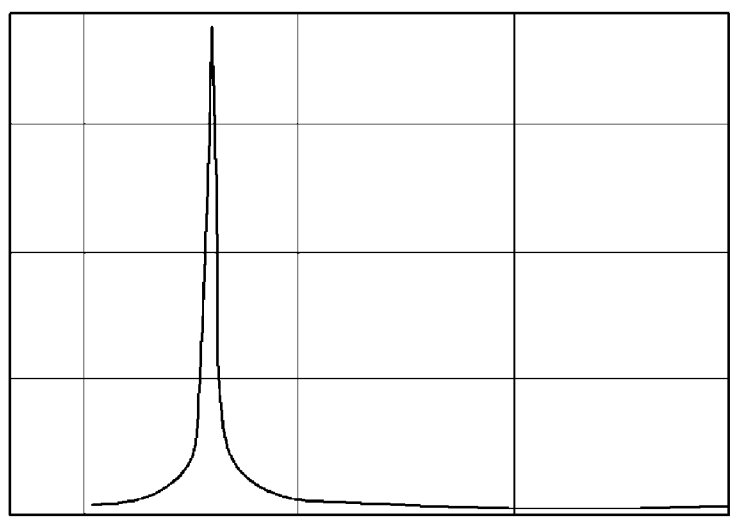

Referring to FIGS. 1 to 3, an apparatus 100 for diagnosing a fault of a fuel cell stack is configured to include a fuel cell stack 110, a first frequency filter 120, a second frequency filter 130, a voltage monitoring unit 140, and a fuel cell stack fault diagnosing unit 150.

The fuel cell stack 110 may be configured by continuously arranging a plurality of unit cells, and a diagnosis may start when a summed current obtained by summing currents of different frequency regions is applied to the fuel cell stack 110.

In the exemplary embodiment of the present invention, the diagnosis may start when a summed current having a form in which a frequency used to calculate a total harmonic distortion (THD) and a frequency used to calculate an impedance are summed is applied to the fuel cell stack 110.

The first frequency filter 120 may receive output voltages of the fuel cell stack 110 and extract a specific frequency to a frequency of the specific frequency or more as diagnosis data. The first frequency filter 120 may provide the diagnosis data to the fuel cell stack fault diagnosing unit 150.

In the exemplary embodiment of the present invention, the first frequency filter 120 may receive the output voltages of the fuel cell stack 110 and pass a basic wave frequency to a harmonic frequency as illustrated in a graph 210 of FIG. 2 used to calculate the THD therethrough to extract diagnosis data as illustrated in a graph 310 of FIG. 3. For example, in the case in which a basic wave is 10 Hz, the first frequency filter 120 may extract a frequency of 10 Hz or more from the output voltages of the fuel cell stack 110. In the exemplary embodiment of the present invention, the first frequency filter 120 may include a high pass filter (HPF).

The second frequency filter 130 may receive the output voltages of the fuel cell stack 110 and extract a specific frequency as diagnosis data. The second frequency filter 130 may provide the diagnosis data to the fuel cell stack fault diagnosing unit 150.

In the exemplary embodiment of the present invention, the second frequency filter may receive the output voltages of the fuel cell stack 110 and pass a specific frequency as illustrated in a graph 220 of FIG. 2 used to calculate the impedance therethrough to extract diagnosis data as illustrated in a graph 320 of FIG. 3. For example, the second frequency filter 130 may extract a frequency of 300 Hz. In the exemplary embodiment of the present invention, the second frequency filter 130 may include a band pass filter (BPF).

The voltage monitoring unit 140 monitors voltages of the frequencies filtered by each of the first and second frequency filters 120 and 130.

The fuel cell stack fault diagnosing unit 150 diagnoses a fault of the fuel cell stack 110 using the voltages monitored by the voltage monitoring unit 140.

In the exemplary embodiment of the present invention, the fuel cell stack fault diagnosing unit 150 may calculate a THD using the specific frequency to the frequency of the specific frequency or more received as the diagnosis data from the first frequency filter 120 and diagnose the fault of the fuel cell stack 110 using the THD. For example, the fuel cell stack fault diagnosing unit 150 may receive the basic wave frequency to the harmonic frequency from the first frequency filter 120 and diagnose the fault of the fuel cell stack 110 using a ratio of the harmonic frequency to the basic wave frequency. The fuel cell stack fault diagnosing unit 150 may diagnose that the fault has been generated in the fuel cell stack 110 when the ratio of the harmonic frequency to the basic wave frequency is a specific ratio or more.

In another exemplary embodiment of the present invention, the fuel cell stack fault diagnosing unit 150 may diagnose a wetting state of the fuel cell stack 110 using the impedance of the specific frequency received as the diagnosis data from the second frequency filter 130. As an example, the fuel cell stack fault diagnosing unit 150 may diagnose that an electrolyte membrane of the fuel cell stack 110 is in a dry state when the impedance of the specific frequency received from the second frequency filter 130 is a specific impedance or more. As another example, the fuel cell stack fault diagnosing unit 150 may diagnose that an electrolyte membrane of the fuel cell stack 110 is in a wet state when the impedance of the specific frequency received from the second frequency filter 130 is a specific impedance or less.

Figure 4:
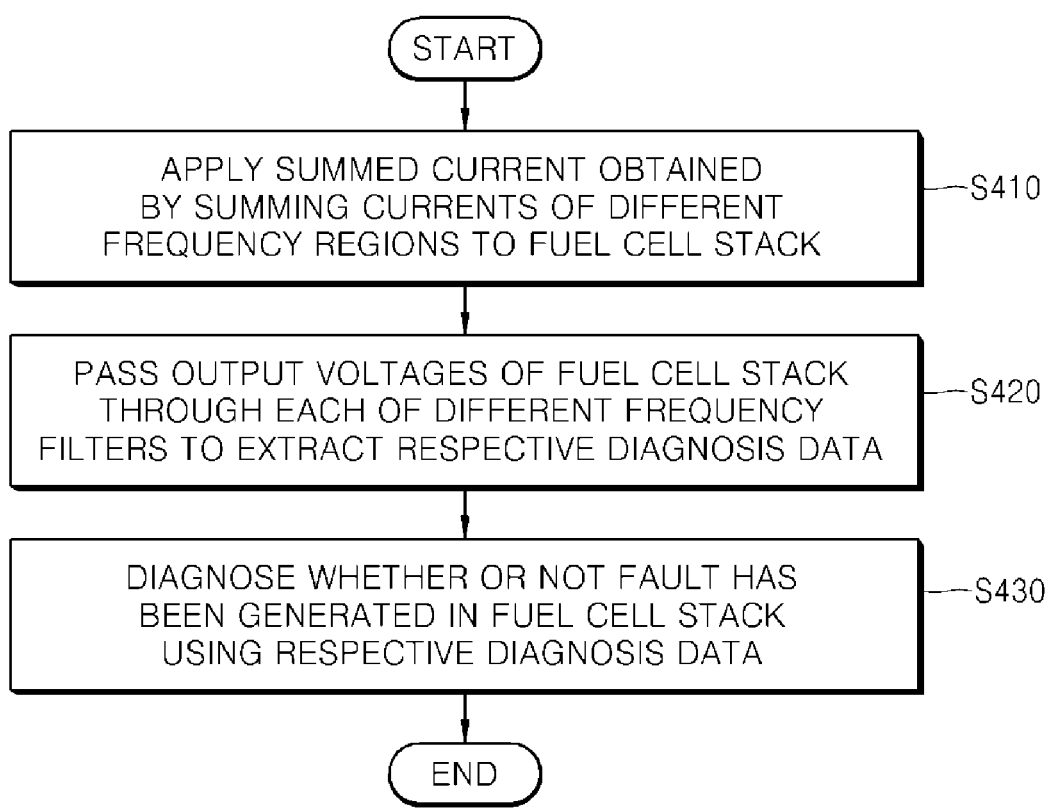
FIG. 4 is a flow chart for describing an example of a method for diagnosing a fault of a fuel cell stack according to an exemplary embodiment of the present invention.

FIG. 4 is a flow chart for describing an example of a method for diagnosing a fault of a fuel cell stack according to an exemplary embodiment of the present invention. The example of FIG. 4 relates to an example capable of diagnosing a state of an inner portion of a fuel cell stack by simultaneously monitoring an impedance and a THD using diagnosis data obtained by filtering output voltages of the fuel cell stack by different frequency filters.

Referring to FIG. 4, the apparatus 100 for diagnosing a fuel cell stack applies a summed current obtained by summing currents of different frequency regions to the fuel cell stack (S410). Then, the apparatus 100 for diagnosing a fuel cell stack passes output voltages of the fuel cell stack through each of the different frequency filters to extract the respective diagnosis data (S420). Next, the apparatus 100 for diagnosing a fuel cell stack diagnoses whether or not a fault has been generated in the fuel cell stack using the respective diagnosis data (S430).

According to the exemplary embodiment of the present invention, it is possible to further improve diagnosis analysis capability by applying the summed current obtained by summing the currents of the different frequency regions to the fuel cell stack and then rapidly diagnosing the fault of the fuel cell stack using the diagnosis data obtained by filtering the output voltages of the fuel cell stack.

According to the exemplary embodiment of the present invention, it is possible to improve diagnosis analysis capability two times or more by simultaneously monitoring the impedance and the THD using the diagnosis data obtained by filtering the output voltages of the fuel cell stack to diagnose a state of an inner portion of the fuel cell stack.

Hereinabove, although specific exemplary embodiments of the present invention have been described, various modifications may be made without departing from the scope of the present invention. Accordingly, the scope of the present invention is not construed as being limited to the described exemplary embodiments, but should be defined by the following claims as well as equivalents thereof.

Although the present invention has been described with reference to the exemplary embodiments and the accompanying drawings, it is not limited to the above-mentioned exemplary embodiments, but may be variously modified and altered from the above description by those skilled in the art to which the present invention pertains. Therefore, the scope and spirit of the present invention should be understood only by the following claims, and all of the equivalences and equivalent modifications of the claims should be intended to fall within the scope and spirit of the present invention.

What is claimed is:

1. A method for diagnosing a fault of a fuel cell stack performed by an apparatus for diagnosing a fault of a fuel cell stack, the method comprising:
   applying a summed current obtained by summing currents of different frequency regions including a frequency used to calculate at least one of a total harmonic distortion(THD) and an impedance to the fuel cell stack;
   passing output voltages of the fuel cell stack through each of different frequency filters including a high pass filter and a band pass filter to extract simultaneously the respective diagnosis data by passing the output voltages of the fuel cell stack through the high pass filter to extract a basic wave frequency to a harmonic frequency for calculating the total harmonic distortion and passing the output voltages of the fuel cell stack through the band pass filter to extract a specific frequency for calculating the impedance; and
   diagnosing whether or not the fault and wetting state of the fuel cell stack have been generated in the fuel cell stack using the respective diagnosis data.

2. The method of claim 1, wherein the diagnosing of whether or not the fault and wetting state of the fuel cell stack has been generated in the fuel cell stack using the respective diagnosis data includes diagnosing whether or not the fault has been generated in the fuel cell stack depending on a ratio of the harmonic frequency to the basic wave frequency extracted by the high pass filter.

3. The method of claim 2, wherein the diagnosing of whether or not the fault and wetting state of the fuel cell stack has been generated in the fuel cell stack using the respective diagnosis data includes diagnosing that the fault has been generated in the fuel cell stack when the ratio of the harmonic frequency to the basic wave frequency is a specific ratio or more.

4. The method of claim 1, wherein the diagnosing of whether or not the fault and wetting state of the fuel cell stack has been generated in the fuel cell stack using the respective diagnosis data includes diagnosing a wetting state of the fuel cell stack using an impedance for the specific frequency extracted by the band pass filter.

5. The method of claim 4, wherein the diagnosing of whether or not the fault and wetting state of the fuel cell stack has been generated in the fuel cell stack using the respective diagnosis data includes diagnosing that an electrolyte membrane of the fuel cell stack is in a dry state when the impedance for the specific frequency is a specific impedance or more.

6. The method of claim 4, wherein the diagnosing of whether or not the fault and wetting state of the fuel cell stack has been generated in the fuel cell stack using the respective diagnosis data includes diagnosing that an electrolyte membrane of the fuel cell stack is in a wet state when the impedance for the specific frequency is a specific impedance or less.

* * * * *